US010003198B2

(12) United States Patent
Pan et al.

(10) Patent No.: US 10,003,198 B2
(45) Date of Patent: Jun. 19, 2018

(54) METHOD AND DEVICE FOR MONITORING AND SUPPRESSING RESONANCE (71) Applicant: Sungrow Power Supply Co., Ltd., Hefei, Anhui (CN)

(72) Inventors: Nianan Pan, Anhui (CN); Lin Cheng, Anhui (CN); Lei Tao, Anhui (CN)

(73) Assignee: SUNGROW POWER SUPPLY CO., LTD., Hefei (CN)

( * ) Notice: Subject to any disclaimer, the term of this patent is extended or adjusted under 35 U.S.C. 154(b) by 315 days.

(21) Appl. No.: 14/850,649

(22) Filed: Sep. 10, 2015

(65) Prior Publication Data
US 2016/0079758 A1    Mar. 17, 2016

(30) Foreign Application Priority Data

Sep. 12, 2014 (CN) .......................... 2014 1 0465695
Sep. 12, 2014 (CN) .......................... 2014 1 0465702

(51) Int. Cl.
*H02J 3/38* (2006.01)
*H02M 7/42* (2006.01)
(Continued)

(52) U.S. Cl.
CPC ............. *H02J 3/383* (2013.01); *G01R 23/20* (2013.01); *H02J 3/01* (2013.01); *H02J 3/38* (2013.01);
(Continued)

(58) Field of Classification Search
CPC .. H02J 3/383; H02J 3/386; H02J 3/387; H02J 3/01; H02J 3/38; H02M 1/12; H02M 2001/0012; G01R 23/20
(Continued)

(56) References Cited

U.S. PATENT DOCUMENTS 8,780,592 B1    7/2014  Jones et al.
2013/0076293 A1  3/2013  Chen et al.

FOREIGN PATENT DOCUMENTS

CN    103023290 A    4/2013
CN    103023364 A    4/2013
(Continued)

OTHER PUBLICATIONS

Japanese Office Action to JP2014-178474 dated Sep. 1, 1928 (6 pages).
(Continued)

*Primary Examiner* — Rexford Barnie
*Assistant Examiner* — Elim Ortiz
(74) *Attorney, Agent, or Firm* — Conley Rose, P.C.

(57) ABSTRACT

A method and device for monitoring and suppressing a resonance are provided, which are applied to a grid-connected generation system. A current sample voltage of a preset sample point of the grid-connected generation system is monitored in a real time manner; amplitudes of harmonics of the current sample voltage are acquired using a preset algorithm; it is verified whether a resonance occurs in the grid-connected generation system currently based on the acquired amplitudes of the harmonics; in a case that the resonance occurs in the grid-connected generation system, current corrections of parameters of inverters in the grid-connected generation system are acquired according to a preset rule and the parameters of the inverters are adjusted using the current corrections and a selected resonance suppressing algorithm.

8 Claims, 3 Drawing Sheets (51) Int. Cl.
*G01R 23/20* (2006.01)
*H02M 1/12* (2006.01)
*H02J 3/01* (2006.01)
*H02M 1/00* (2006.01)

(52) U.S. Cl.
CPC .............. *H02J 3/386* (2013.01); *H02J 3/387* (2013.01); *H02M 1/12* (2013.01); *H02M 2001/0012* (2013.01)

(58) Field of Classification Search
USPC .......................................................... 307/82
See application file for complete search history.

(56) References Cited

FOREIGN PATENT DOCUMENTS

| | | | |
|---|---|---|---|
| CN | 103117559 A | 5/2013 | |
| CN | 103219745 A | 7/2013 | |
| CN | 103401242 A | 11/2013 | |
| CN | 103701128 A | 4/2014 | |
| CN | 103746587 A | 4/2014 | |
| EP | 0491691 A1 | 7/1992 | |
| EP | 2590291 A1 | 8/2013 | |
| JP | S59149746 | 8/1984 | |
| JP | 2002325358 | 11/2002 | |
| JP | 2009189143 | 8/2009 | |
| JP | 2012504386 | 2/2012 | |
| JP | 2014113034 A | 6/2014 | |
| JP | WO 2014125649 A1 * | 8/2014 | .............. H02J 3/01 |
| WO | WO2010036974 | 4/2010 | |
| WO | 2013/128968 A1 | 9/2013 | |
| WO | 2014125649 A1 | 8/2014 | |

OTHER PUBLICATIONS

English Translation Japanese Office Action to JP2014-178414 dated Sep. 1, 1928 (5 pages).
English Translation of JPS59149746A (4 pages).
Japanese Patent Application No. 2015-178474, Decision of Refusal dated Feb. 14, 2017 (6 pages).
Chinese Patent Application No. 201410465695.0 Second Office Action dated Nov. 2, 2016 (19 pages).
Extended European Search Report for European Patent Application No. 15184730.8 dated Apr. 4, 2016.
Chinese First Office Action dated Dec. 2, 2015, for priority Application No. 201410465702.7 filed Sep. 12, 2014.
Chinese First Office Action with English Summary dated Mar. 4, 2016, for Chinese Application No. 201410465695.0.

* cited by examiner

METHOD AND DEVICE FOR MONITORING AND SUPPRESSING RESONANCE

CROSS REFERENCE OF RELATED APPLICATION

The present application claims the priority to Chinese Patent Application No. 201410465702.7, titled "CONTROL METHOD AND CONTROL DEVICE FOR SUPPRESSING RESONANCE IN GRID-CONNECTED GENERATION SYSTEM", filed on Sep. 12, 2014 with the State Intellectual Property Office of People's Republic of China, and Chinese Patent Application No. 201410465695.0, titled "METHOD AND DEVICE FOR SUPPRESSING RESONANCE IN GRID-CONNECTED INVERTER", filed on Sep. 12, 2014 with the State Intellectual Property Office of People's Republic of China, both of which are incorporated herein by reference in their entireties.

FIELD

The present disclosure relates to the field of a grid-connected generation system, and in particular, to a method and device for monitoring and suppressing a resonance.

BACKGROUND

In the development process of new energy, as grid-connected generation for the new energy, such as a solar battery, a wind power and a fuel cell, becomes increasingly popular, the technology of grid-connected inverter generation becomes a focus for study.

It has been found by the applicant that, in a practical application, as the number of inverters in a grid-connected generation system increases, generally a resonance occurs in the grid-connected generation system due to the undesirable design of a control circuit and the mutual influence among impedances of control devices, thereby decreasing the opportunity for a safe and reliable operation of the grid-connected generation system.

Therefore, in order to suppress the resonance occurred in the grid-connected generation system, the resonance is generally suppressed using an LCL filter included in the inverter in the conventional technology, for example, with a common active damping suppressing method in the field. However, in the conventional active damping resonance suppressing method, a sample sensor is typically added, and the feasibility and stability are poor. Particularly for a large-scale grid-connected generation system, the generated resonance in the system is generally complicated, the resonance cannot be suppressed using a specific resonance suppressing algorithm, and the resonance even increases due to unsuitable control. Thus such a conventional grid-connected generation system cannot be ensured to operate reliably and stably.

SUMMARY OF DISCLOSURE

In view of the above, a method and device for monitoring and suppressing a resonance are disclosed herein, to address the above-described technical problem.

A method for monitoring and suppressing a resonance applied to a grid-connected generation system is provided, and the method includes:

monitoring a current sample voltage of a preset sample point of the grid-connected generation system;

acquiring amplitudes of harmonics of the current sample voltage using a preset algorithm;

verifying whether a resonance occurs in the grid-connected generation system based on the acquired amplitudes of the harmonics; and in a case that the resonance occurs in the grid-connected generation system, acquiring current corrections of parameters of inverters in the grid-connected generation system according to a preset rule, and adjusting the parameters of the inverters using the current corrections and a selected resonance suppressing algorithm until the resonance disappears in the grid-connected generation system.

In an embodiment, the acquiring amplitudes of harmonics of the current sample voltage using a preset algorithm may include:

calculating frequency domain values corresponding to the harmonics of the current sample voltage using an FFT algorithm formula, and the FFT algorithm formula is:

$$x(l) = \sum_{n=0}^{N-1} U_x(n) \times w_N^{ln}$$

$$w_N^{ln} = e^{-j2\pi nl/N}, l = 0, 1, \ldots, N-1,$$

where $U_x(n)$ indicates a discrete signal of the current sample voltage, indicates a frequency domain value corresponding to the current sample voltage after an FFT transformation is performed on the current sample voltage, N indicates the total number of sample points, and $W_N^{ln}$ indicates a weight for the FFT algorithm; and calculating the amplitudes of the harmonics using the frequency domain values and a preset harmonic extracting formula, and the preset harmonic extracting formula is:

$$U_{amp}(k) = \sqrt{X(2k)^2 + X(2k+1)^2} \ k=0,1,\ldots,N/2-1$$

where $U_{amp}(k)$ indicates an amplitude of the k-th harmonic. X(2k) indicates a value of a real part of the frequency domain value corresponding to a -th harmonic, X(2k+1) indicates a value of an imaginary part of the frequency domain value corresponding to the k-th harmonic.

In an embodiment, the verifying whether a resonance occurs in the grid-connected generation system based on the acquired amplitudes of the harmonics may include:

calculating valid values of amplitudes of the harmonics within a preset resonance frequency band using the amplitudes of the harmonics and a preset valid value calculation formula, and the preset valid value calculation formula is:

$$U_r = \frac{1}{N_1} \sqrt{\sum_{k=M_1}^{M_2} U_{amp}(k)^2},$$

where $U_r$ indicates the valid values of the amplitudes of the harmonics within the preset resonance frequency band $[f_{min}, f_{max}]$, $N_1$ indicates the total number of resonances occurred within the preset resonance frequency band, $M_1$ indicates the number of resonances corresponding to a minimum allowable resonance frequency $f_{min}$, $M_2$ indicates the number of resonances corresponding to a maximum allowable resonance frequency $f_{max}$, and $U_{amp}(k)$ indicates the amplitude of the k-th harmonic; and verifying whether the valid values of the amplitudes of the harmonics are not less than a preset harmonic threshold, where it is determined that the resonance occurs in the grid-connected generation system in a case that the valid values of the amplitudes of the harmonics are not less than the preset harmonic threshold.

In an embodiment, the acquiring current corrections of parameters of inverters in the grid-connected generation system according to a preset rule may include:

calculating differences between the valid values of the amplitudes of the harmonics and the preset harmonic threshold to obtain input errors;

adjusting the input errors in proportion or proportion-integral to obtain current output controls; and clipping amplitudes of the current output controls to obtain the current corrections of the parameters of the inverters in the grid-connected generation system.

In an embodiment, the adjusting the parameters of the inverters using the current corrections and a preset resonance suppressing algorithm may include:

adjusting bandwidths of the inverters using the current corrections and a preset adjustment formula, and the preset adjustment formula is:

$$\begin{cases} k_p = k_p + \Delta U_{out} \\ k_p < k_{pmin} \quad k_p = k_{pmin} \end{cases}$$

where $K_p$ indicates a proportion control parameter, $\Delta U_{out}$ indicates the current corrections and $K_{pmin}$ indicates minimum allowable adjustment values of the bandwidths of the inverters; and/or adjusting active damping coefficients of the inverters using a pre-stored active damping algorithm and the current corrections; and/or transmitting respectively the current corrections to the inverters to control an inactive damping resistor to be connected to a respective one of the inverters.

In an embodiment, after the adjusting the parameters of the inverters using the current corrections and a preset resonance suppressing algorithm, the method may further include:

controlling the inverters of the grid-connected generation system to stop operating in a case that the resonance does not disappear in the grid-connected generation system after a preset period of time.

In an embodiment, in a case that the resonance disappears in the grid-connected generation system, the method may further include:

performing a power failure protection on the adjusted parameters of the inverters.

Further provided is a device for monitoring and suppressing a resonance applied to a grid-connection generation system is provided, where the device includes:

a sample conditioning circuit connected to a preset sample point of the grid-connected generation system and configured to monitor a current sample voltage of the preset sample point;

a controller connected to the sample conditioning circuit and configured to acquire amplitudes of harmonics of the current sample voltage using a preset algorithm, verify whether a resonance occurs in the grid-connected generation system based on the acquired amplitudes of the harmonics, and acquire current corrections of parameters of inverters in the grid-connected generation system according to a preset rule in a case that the resonance occurs in the grid-connected generation system;

a communication bus connected to the controller and the inverters in the grid-connected generation system and configured to transmit the current corrections acquired by the controller to the inverters respectively; and an adjusting module connected to the controller and the inverters and configured to adjust the parameters of the inverters using the current corrections and a preset resonance suppressing algorithm until the resonance disappears in the grid-connected generation system.

In an embodiment, the controller may include:

a frequency domain calculation module configured to calculate frequency domain values corresponding to the current sample voltage using an FFT algorithm formula, and the FFT algorithm formula is:

$$x(l) = \sum_{n=0}^{N-1} U_x(n) \times w_N^{ln}$$

$$w_N^{ln} = e^{-j2\pi nl/N}, l = 0, 1, \ldots, N-1,$$

where $U_x(n)$ indicates a discrete signal of the current sample voltage, indicates a frequency domain value corresponding to the current sample voltage after an FFT transformation is performed on the current sample voltage, N indicates the total number of sample points, and $W_N^{ln}$ indicates a weight for the FFT algorithm;

an amplitude calculation module configured to calculate the amplitude of the harmonics using the frequency domain values and a preset harmonic extracting formula, and the preset harmonic extracting formula is:

$$U_{amp}(k) = \sqrt{X(2k)^2 + X(2k+1)^2} \quad k=0,1,\ldots,N/2-1,$$

where $U_{amp}(k)$ indicates an amplitude of the k-th harmonic, $X(2k)$ indicates a value of a real part of the frequency domain value corresponding to a k-th harmonic, $X(2k+1)$ indicates a value of an imaginary part of the frequency domain value corresponding to the k-th harmonic;

a valid value calculation module configured to calculate valid values of the amplitudes of the harmonics within a preset resonance frequency band using the amplitudes of the harmonics and a preset valid value calculation formula, and the preset valid value calculation formula is:

$$U_r = \frac{1}{N_1} \sqrt{\sum_{k=M_1}^{M_2} U_{amp}(k)^2},$$

where $U_r$ indicates the valid values of the amplitudes of the harmonics within the preset resonance frequency band $[f_{min}, f_{max}]$, $N_1$ indicates the total number of resonances occurred within the preset resonance frequency band, $M_1$ indicates the number of resonances corresponding to a minimum allowable resonance frequency $f_{min}$, $M_2$ indicates the number of resonances corresponding to a maximum allowable resonance frequency $f_{max}$, and $U_{amp}(k)$ indicates the amplitude of the k-th harmonic;

a verifying module configured to verify whether the valid values of the amplitudes of the harmonics are not less than a preset harmonic threshold;

an error calculation module configured to calculate differences between the valid values of the amplitudes of the harmonics and the preset harmonic threshold to obtain input errors;

a control acquiring module configured to adjust the input errors in proportion or proportion-integral to obtain current output controls; and an amplitude clipping module configured to clip amplitudes of the current output controls to obtain the current corrections of the parameters of the inverters in the grid-connected generation system.

In an embodiment, the adjusting module may include:

a first adjusting unit configured to adjust bandwidths of the inverters using the current corrections and a preset adjustment formula, and the preset adjustment formula is:

$$\begin{cases} k_p = k_p + \Delta U_{out} \\ k_p < k_{pmin} \quad k_p = k_{pmin}, \end{cases}$$

where $K_p$ indicates a proportion control parameter, $\Delta U_{out}$ indicates the current corrections and $K_{pmin}$ indicates minimum allowable adjustment values of the bandwidths of the inverters;

a second adjusting unit configured to adjust active damping coefficients of the inverters using a preset active damping algorithm and the current corrections; and a third adjusting unit configured to transmit respectively the current corrections to the inverters to control an inactive damping resistor to be connected to a respective one of the inverters.

It follows that, as compared with conventional technology, a method and device for monitoring and suppressing a resonance applied to a grid-connected generation system are provided such that, in certain embodiments of the present disclosure: the current sample voltage of the preset sample point of the grid-connected generation system is monitored in a real time manner; the amplitudes of the harmonics of the current sample voltage are acquired using the preset algorithm; it is verified whether the resonance occurs in the grid-connected generation system currently based on the acquired amplitudes of the harmonics; in a case that the resonance occurs in the grid-connected generation system, the current corrections of the parameters of the inverters in the grid-connected generation system are acquired according to the preset rule; and the parameters of the inverters are adjusted using the current corrections and a selected resonance suppressing algorithm until the resonance disappears in the grid-connected generation system. Therefore, according to embodiments of the present disclosure, the resonance point of the grid-connected generation system is adjusted dynamically to suppress the resonance occurred in the grid-connected generation system, with the intention of providing a reliable and stable operation of the grid-connected generation system.

BRIEF DESCRIPTION OF THE DRAWINGS

In order to clearly describe exemplary embodiments of the present disclosure, the drawings to be used in the description of those embodiments are first introduced briefly. The drawings described below are only for the exemplary embodiments of present disclosure. For those skilled in the art, other drawings may be obtained based on the provided drawings without any creative work.

DETAILED DESCRIPTION OF THE DISCLOSED EXEMPLARY EMBODIMENTS

Exemplary embodiments of the present disclosure are described clearly and completely below in conjunction with the drawings referenced above. The described exemplary embodiments are only some rather than all of the embodiments of the present disclosure. Any other embodiments obtained based on the exemplary embodiments of the present disclosure by those skilled in the art without any creative work fall within the scope of protection of the present disclosure.

A method and device for monitoring and suppressing a resonance applied to a grid-connected generation system are provided. According to the present disclosure, embodiments are provided in which: a current sample voltage of a preset sample point of the grid-connected generation system is monitored in a real time manner; amplitudes of harmonics of the current sample voltage are acquired using a preset algorithm; it is verified whether a resonance occurs in the grid-connected generation system currently based on the acquired amplitudes of the harmonics; in a case that the resonance occurs in the grid-connected generation system, current corrections of parameters of inverters in the grid-connected generation system are acquired according to a preset rule and the parameters of the inverters are adjusted using the current corrections and a selected resonance suppressing algorithm until the resonance disappears in the grid-connected generation system. It follows that, according to certain embodiments disclosed herein, a resonance point of the grid-connected generation system is adjusted dynamically to suppress the resonance occurred in the grid-connected generation system, thereby providing the opportunity for establishing a reliable and stable operation of the grid-connected generation system.

Figure 1:
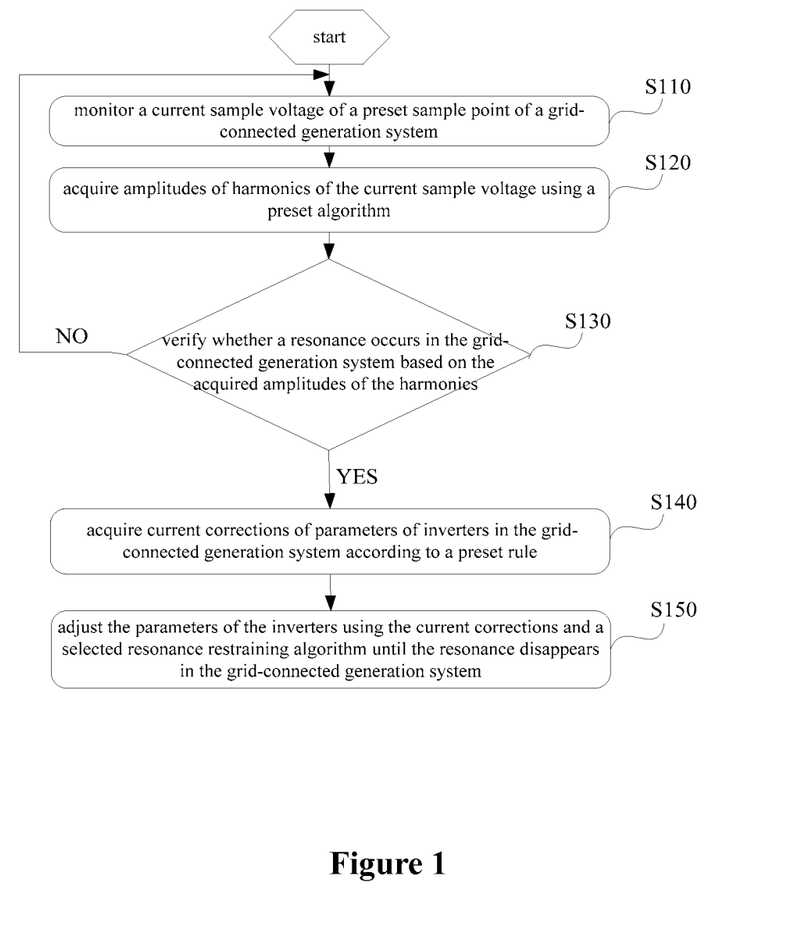
FIG. 1 is a schematic flowchart of a method for monitoring and suppressing a resonance according to an embodiment of the present disclosure.

FIG. 1 shows a schematic flowchart of a method for monitoring and suppressing a resonance according to an embodiment of the present disclosure, and the method may be applied to a gird-connected generation system. According to the embodiment, the method may include step S110 to step S150.

In step S110, a current sample voltage of a preset sample point of the grid-connected generation system is monitored. As used in this disclosure, the term preset shall mean predetermined.

In a practical application, the grid-connected generation system generally includes multiple inverters. Each of the multiple inverters includes one LCL filter, has a communication receiving RX function, and is connected to one step-up transformer via the LCL filter. Hence, in the embodiment, a Point of Common Coupling (PPC point) at a high voltage side of all of the step-up transformers may be defined as the preset sample point, which is not limited herein.

The current sample voltage may be acquired from a voltage transformer at the high voltage side of the grid-connected generation system via a sample conditioning circuit, which is referred to as $U_x$. In the embodiment, the current sample voltage may be a voltage of any one of A/B/C phases or AB/BC/CA phases of a three-phase grid. Generally, the current sample voltage is a line voltage. Specifically, voltage sampling may be performed by sharing a voltage with a Luna Excursion Module (LEM) sensor or resistor; and then the collected voltage is filtered, amplified or reduced, and an output level of the collected voltage is processed via the conditioning circuit in the sample conditioning circuit, to obtain the current sample voltage.

In step S120, amplitudes of harmonics of the current sample voltage are acquired using a preset algorithm.

The preset algorithm may include a Fast Fourier Transform (FFT) algorithm. Hence, in the embodiment, firstly frequency domain values corresponding to the harmonics of the current sample voltage may be calculated using the FFT algorithm formula, and the FFT algorithm formula may be:

$$x(l) = \sum_{n=0}^{N-1} U_x(n) \times w_N^{ln}$$

$$w_N^{ln} = e^{-j2\pi nl/N}, l = 0, 1, \ldots, N-1,$$

where $U_x(n)$ indicates a discrete signal of the current sample voltage; $x(l)$ indicates a frequency domain value corresponding to the current sample voltage after an FFT transformation is performed on the current sample voltage; N indicates the total number of sample points; $\Sigma$ indicates a summation operation; and $W_N^{ln}$ indicates a weight for the FFT algorithm and is a well-known calculation factor in an FFT standard butterfly algorithm, which therefore need not be described in further detail herein.

Then, the amplitudes of the harmonics are calculated using the acquired frequency domain values and a preset harmonic extracting formula, and the preset harmonic extracting formula is:

$$U_{amp}(k) = \sqrt{X(2k)^2 + X(2k+1)^2} \quad K=0,1,\ldots,N/2-1 \qquad (2);$$

where $U_{amp}(k)$ indicates an amplitude of a k-th harmonic, $X(2k)$ indicates a value of a real part of the frequency domain value corresponding to a k-th harmonic, $X(2k+1)$ indicates a value of an imaginary part of the frequency domain value corresponding to the k-th harmonic.

In step S130, it is verified whether a resonance occurs in the grid-connected generation system based on the acquired amplitudes of the harmonics; in a case that the resonance occurs in the grid-connected generation system, the method proceeds to step S140; otherwise, the method returns to step S110.

In a practical application, in a case that the resonance occurs in the grid-connected generation system, the operational reliability and stability of the grid-connected generation system is influenced. Hence, in the embodiment, the grid-connected generation system can be monitored in a real time manner, and the resonance is processed immediately once the resonance occurs, thereby providing the opportunity for establishing a reliable and stable operation of the grid-connected generation system.

Optionally, in the embodiment, assumed that a switching frequency of the grid-connected generation system is $f_s$, a resonance frequency $f_r$ of the gird-connected generation system should be less than $f_s/2$ according to a system design requirement, hence, a maximum allowable resonance frequency $f_{max}$ of the grid-connected generation system may be set to be $f_s/2$. Once the resonance frequency is greater than $f_s/2$, the resonance suppressing algorithm is disabled, that is to say, the resonance cannot be suppressed, and the inverters of the grid-connected generation system may be controlled directly to stop operating.

In addition, in order to ensure a performance of a filter in the grid-connected generation system and improve a system response characteristic, a bandwidth of the system should not be too small. Therefore, the resonance frequency of the grid-connected generation system generally is greater than 1 KHz in the system design, and a minimum allowable resonance frequency $f_{min}$ of the grid-connected generation system may be set to be 1 KHz in the embodiment. It should be noted that, a range of a preset allowable resonance frequency band of the gird-connected generation system is not limited to [1 KHz, $f_s/2$].

According to the analysis above, in the embodiment, the valid values of amplitudes of the harmonics within the preset harmonic frequency band may be calculated using the amplitudes of the harmonics and a preset valid value calculation formula, and the preset valid value calculation formula is:

$$U_r = \frac{1}{N_1} \sqrt{\sum_{k=M_1}^{M_2} U_{amp}(k)^2} \ ;$$

where $U_r$ indicates the valid values of the amplitudes of the harmonics within the preset resonance frequency band $[f_{min}, f_{max}]$, $N_1$ indicates the total number of resonances occurred within the preset resonance frequency band, $M_1$ indicates the number of resonances corresponding to a minimum allowable resonance frequency $f_{min}$, $M_2$ indicates the number of resonances corresponding to a maximum allowable resonance frequency $f_{max}$, and $U_{amp}(k)$ indicates the amplitude of the k-th harmonic.

After the valid values of the amplitudes of the harmonics within the preset resonance frequency band are acquired, it may be verified whether a resonance occurs in the grid-connected generation system currently by determining whether the valid values of the amplitudes of the harmonics are not less than a preset harmonic threshold. In a case that the valid values of the amplitudes of the harmonics are not less than the preset harmonic threshold, it is determined that the resonance occurs in the grid-connected generation system currently and the resonance is needed to be processed in an appropriate suppressing way; in a case that the valid values of the amplitudes of the harmonics are less than the preset harmonic threshold, the method may return to step S110 and it is monitored whether a resonance occurs in the grid-connected generation system.

The preset harmonic threshold may be an allowable harmonic amplitude of an internal unit of the inverter in the grid-connected generation system, which is referred to as $U_{rmin}$, and the preset harmonic threshold may be determined based on a model number of the grid-connected inverter and grid parameters, which is not limited in the present disclosure. Therefore, according to the analysis above, the calculated valid values $U_r$ of the amplitudes of the harmonics are compared with the preset harmonic threshold $U_{rmin}$; in a case that $U_r \geq U_{rmin}$, it is determined that the resonance occurs in the grid-connected generation system; in a case that $U_r < U_{rmin}$, it is determined that the resonance does not occur in the grid-connected generation system, and the method returns to step S110.

Optionally, in a case that it is determined that the resonance occurs in the grid-connected generation system, prompting information may be output to notify a user. The prompting information may be a beep or other sound, voice information or the like, which is not limited in the present disclosure.

In step S140, current corrections of the parameters of the inverters in the grid-connected generation system are acquired according to a preset rule.

In the embodiment, the current corrections may be calculated as follows.

After the valid values Ur of the amplitudes of the harmonics are acquired, differences between the valid values $U_r$ of the amplitudes of the harmonics and the preset harmonic threshold $U_{rmin}$ may be calculated to obtain input errors $U_e$ which equal the difference of $U_{rmin}$ minus $U_r$; then the input errors are adjusted in proportion or a proportion-integral to obtain current output controls $U_0$; and amplitudes of the output controls are clipped to obtain the current corrections of the parameters of the inverters in the grid-connected generation system.

Taking the input errors being adjusted in proportion as an example, in a practical application of the embodiment, the input errors $U_e$ are adjusted according to a formula $U_o = K_\tau U_e = K_\tau (U_{rmin} - U_r)$ to obtain the current output controls $U_0$. $K_\tau$ is a proportional control coefficient, which may be determined based on parameters for providing a stable operation of the grid-connected generation system and a power grid, and is not limited in the present disclosure.

Optionally, the amplitudes of the current output controls $U_O$ may be clipped according to the following amplitude clipping formula, which may be expressed as:

$$\begin{cases} U_o > 0 & \Delta U_{out} = 0 \\ |U_o| > U_{omax} & \Delta U_{out} = -U_{omax}. \end{cases} \quad (4)$$

In the formula, $\Delta U_{out}$ indicates current corrections output after the amplitudes are clipped. $-U_{omax}$ indicates a maximum allowable output value, to avoid the overshooting of the parameters of the inverters due to a great instantaneous change of the current corrections $\Delta U_{out}$ and the damage on the stability of the system.

In step S150, the parameters of the inverters are adjusted using the current corrections and a selected resonance suppressing algorithm until the resonance disappears in the grid-connected generation system.

Optionally, in a practical application, after the current corrections of the parameters of the inverters are acquired, the current corrections may be transmitted to the inverters through a communication bus respectively, the parameters of the inverters are adjusted with the current corrections and resonance points of the inverters are changed, and the valid values of the amplitudes of the harmonics of the monitored current sample voltage are less than the preset harmonic threshold. Hence, the resonance disappears in the grid-connected generation system.

The communication bus may be an RS485 bus or a Controller Area Network (CAN) bus, which is not limited in the present disclosure.

It should be noted that, in a case that the resonance is suppressed by the inverters using the current corrections, any inverter resonance suppressing method may be used according to the characteristics of the inverters, such as an active damping method and an inactive damping method, which is not limited in the present disclosure.

According to the analysis above, in the exemplary embodiment thus disclosed, the current sample voltage of the preset sample point of the grid-connected generation system is monitored in a real time manner; the amplitudes of the harmonics of the current sample voltage are acquired using the preset algorithm; it is verified whether the resonance occurs in the grid-connected generation system currently based on the acquired amplitudes of the harmonics; in a case that the resonance occurs in the grid-connected generation system, the current corrections of the parameters of the inverters in the grid-connected generation system are acquired according to a preset rule and the parameters of the inverters are adjusted using the current corrections and a selected resonance suppressing algorithm until the resonance disappears in the grid-connected generation system. It follows that, according to the present disclosure, the resonance point of the grid-connected generation system is adjusted dynamically to suppress the resonance occurred in the grid-connected generation system, thereby providing the opportunity for establishing a reliable and stable operation of the grid-connected generation system.

Figure 2:
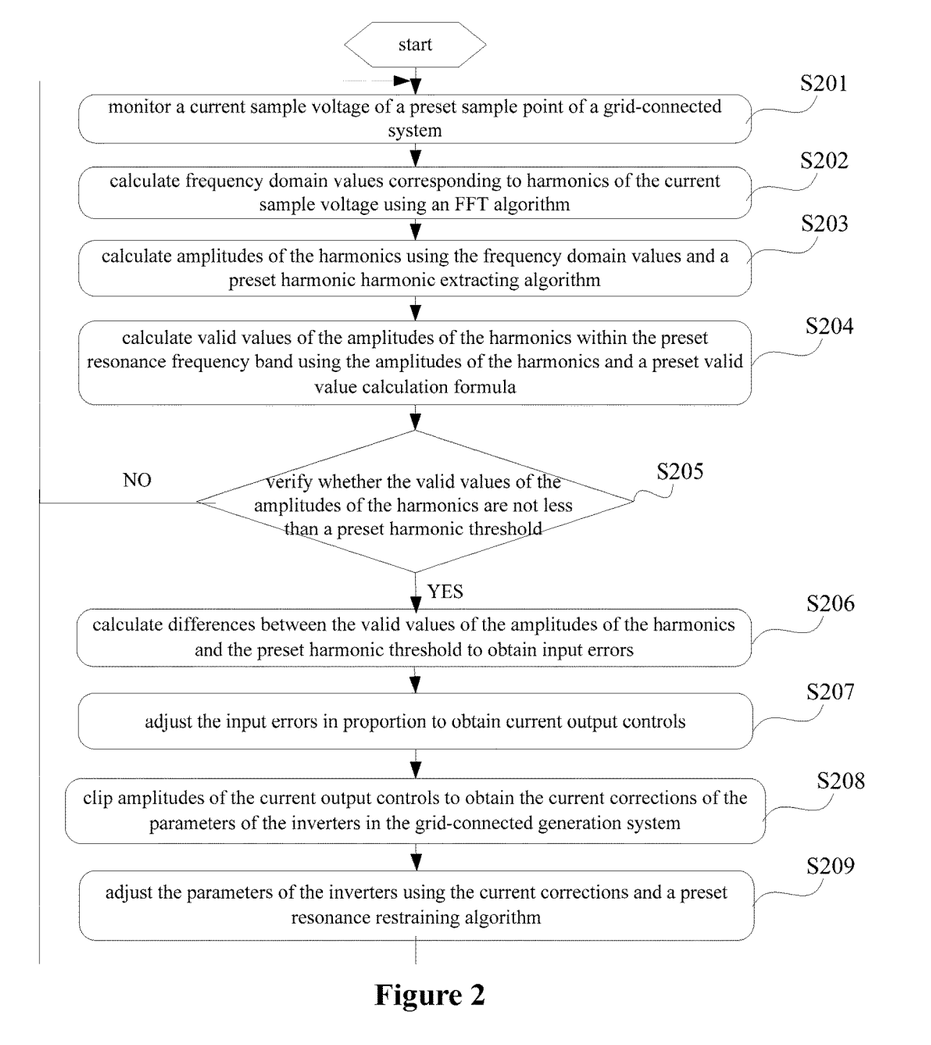
FIG. 2 is a schematic flowchart of a method for monitoring and suppressing a resonance according to another embodiment of the present disclosure.

FIG. 2 shows a schematic flowchart of a method for monitoring and suppressing resonance according to another exemplary embodiment of the present disclosure, which may be applied to a grid-connected generation system. The method may include step S201 to step S209.

In step S201, a current sample voltage of a preset sample point of the grid-connected generation system is monitored.

The grid-connected generation system includes multiple inverters. The preset sample point may be a point of common coupling at a high voltage side of step-up transformers of the system. Generally the current sample voltage is a line voltage.

In step S202, frequency domain values corresponding to harmonics of the current sample voltage are calculated using an FFT algorithm.

An expression of the FFT algorithm may be the above-described formula (1), which need not be further described.

In step S203, amplitudes of the harmonics are calculated using the frequency domain values and a preset harmonic extracting formula.

In the embodiment, the amplitudes of the harmonics may be calculated using the above-described formula (2), and a specific process may be referred to the corresponding part of the above-described embodiment, which need not be further described.

In step S204, valid values of the amplitudes of the harmonics within the preset resonance frequency band are calculated using the amplitudes of the harmonics and a preset valid value calculation formula.

The preset valid value calculation formula may be the above-described formula (3), and a specific process for calculating the valid values of the amplitudes of the harmonics may be referred to the corresponding part of the above embodiment, which need not be further described.

In step S205, it is verified whether the valid values of the amplitudes of the harmonics are not less than a preset harmonic threshold; in a case that the valid values are not less than the preset harmonic threshold, the method proceeds to step S206; otherwise, the method returns to step S201.

In the embodiment of the present disclosure, the preset harmonic threshold may be an allowable harmonic amplitude of an internal unit of an inverter in the grid-connected generation system, which is referred to as $U_{rmin}$. In a case that the calculated amplitudes of the harmonics are greater than or equal to the preset harmonic threshold, it is indicated that the resonance occurs in the grid-connected generation system and the resonance is needed to be suppressed in a real time manner, thereby providing the opportunity for establishing a reliable and stable operation of the grid-connected generation system.

In an embodiment, in a case that it is determined the resonance occurs in the grid-connected generation system, prompting information may be output to prompt a user. The way of outputting the prompting information is not limited in the embodiment, and any way obtained by those skilled in the art without any creative work falls within the scope of protection of the present disclosure.

In step S206, differences between the valid values of the amplitudes of the harmonics and the preset harmonic threshold are calculated to obtain input errors.

According to the description of the corresponding part of the above embodiment, the input error $U_e$ equals the difference of $U_{rmin}$ minus $U_r$.

In step S207, the input errors are adjusted in proportion to obtain current output controls.

It should be noted that, in the present disclosure, the input errors may be adjusted in a proportion-integral control instead of the proportion control. In the embodiment, taking the proportion control as an example, the input errors $U_e$ may be adjusted according to a formula $U_0 = K_\tau U_e = K_\tau (U_{rmin} - U_r)$ to obtain current output controls $U_0$.

$K_\tau$ is a proportion control coefficient, which may be determined based on parameters for providing a stable operation of the grid-connected generation system and a power grid, and is not limited in the present disclosure.

In step S208, amplitudes of the current output controls are clipped to obtain current corrections of the parameters of the inverters in the grid-connected generation system.

In the embodiment, the amplitudes of the current output controls may be clipped using the above-described formula (4), and a specific process may be referred to the description of the corresponding part of the above embodiment. In step S209, the parameters of the inverters are adjusted using the current corrections and a preset resonance suppressing algorithm, and the method returns to step S201.

In a practical application, in a case that the parameters of the inverter are adjusted using the current corrections, the system monitors a current sample voltage of the preset sample point of the adjusted grid-connected generation system; the parameters of the inverter are not adjusted in a case that it is determined that the valid values of the amplitudes of the harmonics of the current sample voltage are less than the preset harmonic threshold.

For any one of the inverters, any one of the following ways may be used to adjust the parameter, however, the adjustment way is not limited to the following expressly-described ways. Different parameter adjusting ways or the same parameter adjusting way may be used for different inverters.

First Parameter Adjusting Way

A bandwidth $\Delta\omega_B$ of the inverter is adjusted using the received current correction $\Delta U_{out}$ and a preset adjustment formula, and the preset adjustment formula may be expressed as:

$$\begin{cases} k_p = k_p + \Delta U_{out} \\ k_p < k_{pmin} \quad k_p = k_{pmin}; \end{cases} \quad (5)$$

where $K_p$ indicates a proportion control parameter, and $K_{pmin}$ indicates a minimum allowable adjustment value of the bandwidth of the inverter.

In the first way of the embodiment, an automatic control theory is used. The resonance point of the system changes as the proportion control parameter $k_p$ changes; the inverters in the grid-connected generation system can identify the resonance frequency band intelligently, and change their own resonance points using the received current corrections, thereby avoiding the resonance in the system and suppressing the resonance.

Second Parameter Adjusting Way

Active damping coefficients of the inverters are adjusted using a pre-stored active damping algorithm and the current corrections.

In a practical application of the embodiment, after the active damping suppressing resonance method is selected based on characteristics of the inverters, the pre-stored active damping algorithm may be called, and active damping coefficients $K_r$ of the inverters are adjusted using the received current corrections. The adjustment may be performed based on the following formula.

$$\begin{cases} k_r = k_r + \Delta U_{out} \\ k_r < k_{rmin} \quad k_r = k_{rmin} \\ k_r > k_{rmax} \quad k_r = k_{rmax}. \end{cases} \quad (6)$$

In the above-described formula (6), $k_r$ indicates an active damping coefficient, $\Delta U_{out}$ indicates the obtained current correction, and $K_{rmin}$ and $K_{rmax}$ indicate a minimum adjustment value and a maximum adjustment value of the active damping system of the inverter respectively.

In a practical application of the embodiment, since a differential operation is introduced in the active damping algorithm, the damping coefficient $k_r$ should not be too great, to prevent the noise from being amplified.

Third Parameter Adjusting Way

According to an inactive damping principle, after the obtained current corrections are transmitted to the inverters respectively, an inactive damping resistor may be controlled to be connected to a control circuit of the inverter, thereby suppressing the resonance.

Extra loss such as heat dissipation of the device is increased and the system efficiency is reduced since the inactive damping resistance is added. Hence, in a case that it is determined that the valid values of the amplitudes of the harmonics are less than the preset harmonic threshold, the connected inactive damping resistor may be disconnected to strike a balance among the system efficiency, the stability and the resonance suppressing.

As another embodiment of the present disclosure, a priority may be preset for the above-described three adjustment ways. For example, corresponding resonance suppressing algorithms may be called in an order of the first way, the second way and the third way, which is not limited herein. Once the adjustment is completed in any one of the above-described ways, it is verified whether the valid value of the current harmonic amplitude is less than the preset harmonic threshold; in a case that the valid value is less than the preset harmonic threshold, the method returns to step S201; otherwise, the parameters of the inverters may be adjusted by calling a resonance suppressing algorithm with a next priority, until the resonance disappears in the grid-connected generation system.

Optionally, according to the above-described embodiments, after the parameters of the inverters are adjusted such that the resonance disappears in the grid-connected generation system, a power failure protection may be performed on the adjusted parameters of the inverters. Practically, in a case that the parameters of the inverters are adjusted using the above ways and the resonance does not disappear in the grid-connected generation system after the preset period of time, that is, the valid values of the amplitudes of the harmonics are still not greater than the preset harmonic threshold, the inverters of the grid-connected generation system may be controlled to stop operating, to prevent an internal unit of the inverter from being damaged due to the resonance.

According to the analysis above, in an embodiment of the present disclosure, the current sample voltage of the preset sample point of the grid-connected generation system is monitored in a real time manner; the amplitudes of the harmonics of the current sample voltage are acquired using the preset algorithm; it is verified whether the resonance occurs in the grid-connected generation system currently based on the acquired amplitudes of the harmonics; in a case that the resonance occurs in the grid-connected generation system, the current corrections of the parameters of the inverters in the grid-connected generation system are obtained according to a preset rule; and the parameters of the inverters are adjusted using the current corrections and a selected resonance suppressing algorithm, until the resonance disappears in the grid-connected generation system. It follows that, according to the present disclosure, the resonance point of the grid-connected generation system is adjusted dynamically to suppress the resonance occurred in the grid-connected generation system, thereby providing the opportunity for establishing a reliable and stable operation of the grid-connected generation system.

Figure 3:
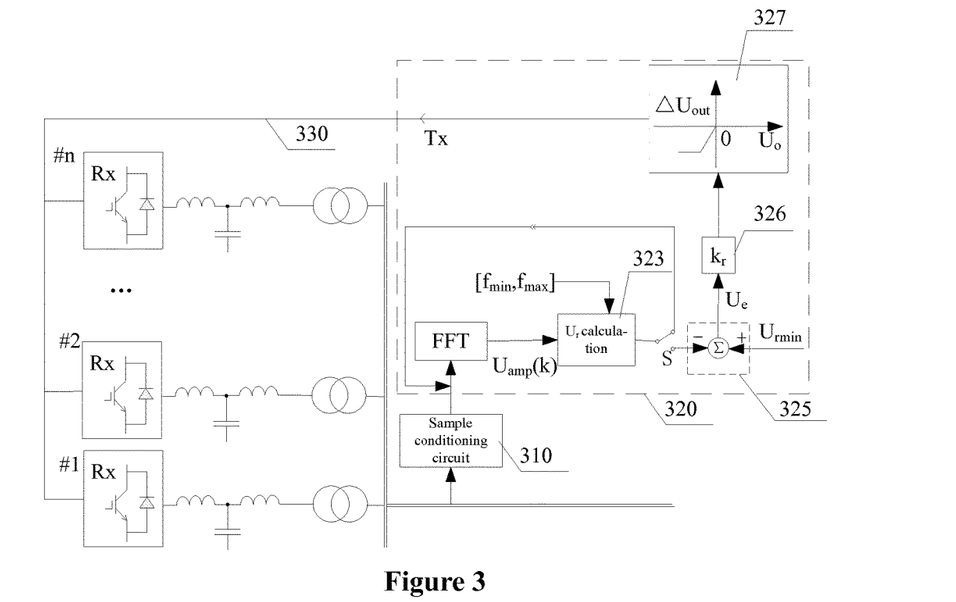
FIG. 3 is a schematic structural diagram of a device for monitoring and suppressing a resonance according to an embodiment of the present disclosure.

FIG. 3 shows a schematic structural diagram of a device for monitoring and suppressing a resonance according to an embodiment of the present disclosure, and the device may be applied to a grid-connected generation system. In the present embodiment, the device may include a sample conditioning circuit 310, a controller 320, a communication bus 330 and an adjusting module 340.

The sample conditioning circuit 310 is connected to a preset sample point of the grid-connected generation system and configured to monitor a current sample voltage of the preset sample point.

The grid-connected generation system may include multiple inverters. Each of the multiple inverters is connected to one step-up transformer via one LCL filter and has a communication receiving RX function. Hence, the present sample point of the sample conditioning circuit 310 may be defined as a point of common coupling (PCC point) at a high voltage side of all of the step-up transformers.

In a practical application, generally an alternate current signal at the high voltage side may be collected via a line voltage transformer in a high voltage distributing box, hence, an input terminal of the sample conditioning circuit 310 may be connected to the line voltage transformer, and a sample signal, i.e., a line voltage output from the line voltage transformer is detected in a real time manner by sharing a voltage with an LEM sensor or resistor. The sample signal is filtered, amplified or reduced to obtain the current sample voltage.

According to the above description of the function of the sample conditioning circuit 310, those skilled in the art may obtain a specific circuit structure of the sample conditioning circuit 310 in conjunction with the conventional technology, which is not detailed in the embodiment described.

The controller 320 is connected to the sample conditioning circuit 310 and configured to acquire amplitudes of harmonics of the current sample voltage using a preset algorithm; verify whether a resonance occurs in the grid-connected generation system based on the acquired amplitudes of the harmonics; and obtain current corrections of parameters of the inverters in the grid-connected generation system according to a preset rule in a case that the resonance occurs in the grid-connected generation system.

In the embodiment, the specific function of the controller 320 may be referred to the description of the corresponding part of the above method embodiment, which need not be further described in the embodiment.

The controller 320 includes an analog-digital conversion circuit configured to perform analog-digital conversion on the current sample voltage output from the sample conditioning circuit 310 to facilitate later processing.

The communication bus 330 is connected to the controller 320 and the inverters (n inverters, namely an inverter #1 to an inverter #n as shown in FIG. 3, which is not limited) in the grid-connected generation system and configured to transmit respectively the current corrections acquired by the controller 320 to the inverters in the grid-connected generation system.

The communication bus 330 may be an RS485 bus or a CAN bus, which is not limited herein.

The adjusting module 340 (not shown in FIG. 3) is connected to the controller 320 and the inverters and configured to adjust the parameters of the inverters using the current corrections and a preset resonance suppressing algorithm, until the resonance disappears in the grid-connected generation system.

In the embodiment, the specific adjusting process performed by the adjusting module 340 on the parameters of the inverters may be referred to the description of the corresponding part of the above method embodiment, which need not be further described.

Optionally, based on the above embodiment, the device may further include an alarming device connected to the controller 320, and the alarming device is configured to output prompting information in a case that the controller 320 determines that a resonance occurs in the grid-connected generation system. The alarming device may be a buzzer, a voice module or the like, which is not limited in the present disclosure.

According to the analysis above, in this exemplary embodiment of the present disclosure, the current sample voltage of the preset sample point of the grid-connected generation system is monitored in a real time manner; the amplitudes of the harmonics of the current sample voltage are acquired using the preset algorithm; it is verified whether the resonance occurs in the grid-connected generation system currently based on the acquired amplitudes of the harmonics; in a case that the resonance occurs in the grid-connected generation system, the current corrections of the parameters of the inverters in the grid-connected generation system are acquired according to a preset rule and the parameters of the inverters are adjusted using the current corrections and a selected resonance suppressing algorithm, until the resonance disappears in the grid-connected generation system. It follows that, according to the present disclosure, the resonance point of the grid-connected generation system is adjusted dynamically to suppress the resonance occurred in the grid-connected generation system, thereby providing the opportunity for establishing a reliable and stable operation of the grid-connected generation system.

As another embodiment of the present disclosure, based on the above embodiments, the controller 320 may include a frequency domain calculation module 321 (not shown in FIG. 3), an amplitude calculation module 322 (not shown in FIG. 3), a valid value calculation module 323, a verifying module 324 (not shown in FIG. 3), an error calculation module 325, a control acquiring module 326 and an amplitude clipping module 327.

The frequency domain calculation module 321 is configured to calculate frequency domain values corresponding to the current sample voltage using an FFT algorithm formula, where the preset FFT algorithm formula may be:

$$x(l) = \sum_{n=0}^{N-1} U_x(n) \times w_N^{ln}$$

$$w_N^{ln} = e^{-j2\pi nl/N}, l = 0, 1, \ldots, N-1,$$

where $U_x(n)$ indicates a discrete signal of the current sample voltage, $x(l)$ indicates a frequency domain value corresponding to the current sample voltage after the FFT transformation is performed on the current sample voltage, N indicates the total number of sample points, $W_N^{ln}$ indicates a weight for the FFT algorithm.

The amplitude calculation module 322 is configured to calculate amplitudes of harmonics using the frequency domain values and a preset harmonic extracting formula, and the preset harmonic extracting formula may be:

$$U_{amp}(k) = \sqrt{X(2k)^2 + X(2k+1)^2} \quad k=0,1,\ldots,N/2-1;$$

where $U_{amp}(k)$ indicates an amplitude of a k-th harmonic, $X(2k)$ indicates a value of a real part of the frequency domain value corresponding to a k-th harmonic, $X(2k+1)$ indicates a value of an imaginary part of the frequency domain value corresponding to the k-th harmonic.

In the embodiment, the frequency domain calculation module 321 and the amplitude calculation module 322 are arranged in the FFT block shown in FIG. 3.

The valid value calculation module 323 is configured to calculate valid values of the amplitudes of the harmonics within a preset resonance frequency band using the amplitudes of the harmonics and a preset valid value calculation formula, and the preset valid value calculation formula may be:

$$U_r = \frac{1}{N_1} \sqrt{\sum_{k=M_1}^{M_2} U_{amp}(k)^2};$$

where $U_r$ indicates the valid values of the amplitudes of the harmonics within the preset resonance frequency band [$f_{min}$, $f_{max}$], $N_1$ indicates the total number of resonances within the preset resonance frequency band, $M_1$ indicates the number of resonances corresponding to a minimum allowable resonance frequency $f_{min}$, $M_2$ indicates the number of resonances corresponding to a maximum allowable resonance frequency $f_{max}$, and $U_{amp}(k)$ indicates the amplitude of the k-th harmonic.

The verifying module 324 is configured to verify whether the valid values of the amplitudes of the harmonics are not less than a preset harmonic threshold.

The preset harmonic threshold may be an allowable harmonic amplitude of an internal unit of an inverter in the grid-connected generation system, which is referred to as $U_{min}$, and the preset harmonic threshold may be determined based on a specific model number of the grid-connected inverter and grid parameters, which is not limited in the present disclosure.

In the embodiment, in a case that it is verified that the valid values of the amplitudes of the harmonics are not less than the preset harmonic threshold, it is indicated that a resonance occurs in the grid-connected generation system currently.

According to the analysis above, as shown in FIG. 3, a closed loop, i.e., a resonance amplitude control loop, is formed in the structure of the device according to the present disclosure, thereby adjusting the resonance in the grid-connected generation system dynamically, and providing the opportunity for establishing a reliable and stable operation of the grid-connected generation system.

The error calculation module 325 is configured to calculate differences between the valid values of the amplitudes of the harmonics and the preset harmonic threshold to obtain input errors.

According to the analysis above, the input error equals the difference of the preset harmonic threshold minus the valid value of the amplitude of the harmonic, which is not limited.

The control acquiring module 326 is configured to adjust the input errors in proportion or proportion-integral to obtain current output controls.

The amplitude clipping module 327 is configured to clip amplitudes of the current output controls to obtain current corrections of the parameters of the inverters in the grid-connected generation system.

In the embodiment, the amplitudes of the current output controls may be clipped using the above formula (4), a specific process may be referred to the description of the corresponding part of the above method embodiment, which therefore need not be further described. The ways for clipping the amplitudes are not limited to the above-described ways, any way obtained by those skilled in the art without any creative work falls within the scope of protection of the present disclosure.

Figure 4:
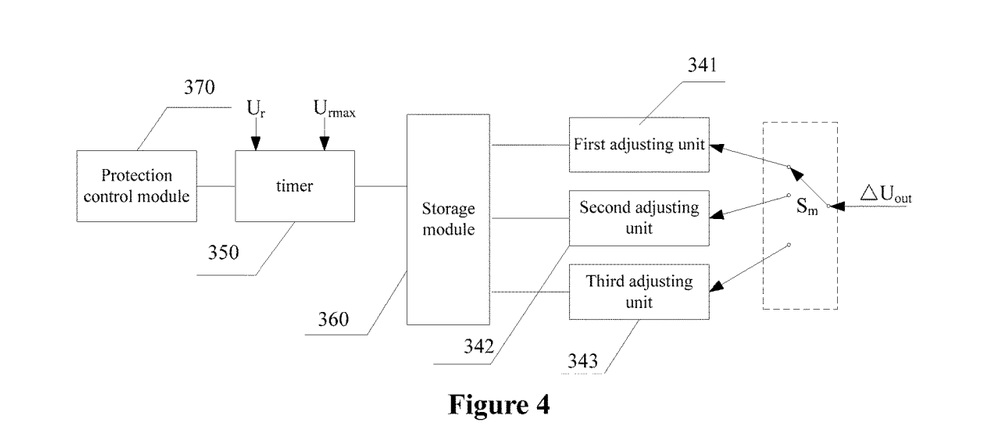
FIG. 4 is schematic structural diagram of a part of a device for monitoring and suppressing a resonance according to an embodiment of the present disclosure.

In addition, in order to adjust the parameters of the inverters in the above-described embodiments, for the inverters, the adjusting module 340 may include a first adjusting unit 341, a second adjusting unit 342 and a third adjusting unit 343, as shown in FIG. 4.

The first adjusting unit 341 is configured to adjust bandwidths of the inverters using the current corrections and a preset adjustment formula, and the preset adjustment formula may be:

$$\begin{cases} k_p = k_p + \Delta U_{out} \\ k_p < k_{pmin} \quad k_p = k_{pmin}, \end{cases}$$

where $k_p$ indicates a proportion control parameter, $\Delta U_{out}$ indicates the current corrections, and $k_{pmin}$ indicates minimum allowable adjustment values of the bandwidths of the inverters.

The second adjusting unit 342 is configured to adjust active damping coefficients of the inverters using a preset active damping algorithm and the current corrections.

In the embodiment, the active damping adjustment may be performed using the above formula (6), and a specific process may be referred to the description of the corresponding part of the above method embodiment, which need not be further described in the embodiment.

The third adjusting unit 343 is configured to transmit respectively the current corrections to the inverters to control the inactive damping resistor to be connected to a respective one of the inverters.

In order to avoid a system loss since the inactive damping resistor is connected to an control circuit of the inverter, the inactive damping resistor may be disconnected in a case that it is verified that the resonance does not occur in the grid-connected generation system, that is, the valid values of the amplitudes of the harmonics are less than the preset harmonic threshold.

In addition, in a practical application, the first adjusting unit, the second adjusting unit and the third adjusting unit may be triggered according to a preset priority, and a specific order of priority is not limited in the present disclosure.

Optionally, as shown in FIG. 4, the device may further include a timer 350 (not shown in FIG. 4) and a storage module 360.

The timer 350 is configured to track the correction effect of the parameters of the inverters. The timer is started once the parameters of the inverters are adjusted using the first adjusting unit, the second adjusting unit and/or the third adjusting unit; and it is determined whether the valid values $U_r$ of the corrected amplitudes of the harmonics of the current sample voltage changes in a real time manner within a predetermined period of time.

As shown in FIG. 4, in a case that the verifying module 324 verifies that the resonance occurs in the grid-connected generation system, a switch S is controlled to switch from the left side to the right side, the error calculation module 325 calculates the received valid values of the amplitudes of the harmonics to obtain input errors and transmits the input errors to the control acquiring module 326. In FIG. 4, the input errors are adjusted in a proportion control to obtain current output controls $U_0$, and then amplitudes of the current output controls $U_0$ are clipped by the amplitude clipping module 327 to obtain current corrections $\Delta U_{out}$. The adjusting module 340 may be connected to the first adjusting unit 341, the second adjusting unit 342 and the third adjusting unit 343 sequentially according to a preset priority $S_m$, thereby adjusting the parameters of the grid-connected inverter.

The storage module 360 is configured to perform a power failure protection on the corrected parameters of the inverters in a case that the valid values of the amplitudes of the harmonics are reduced gradually and are less than the preset harmonic threshold $U_{rmin}$, and the related parameters are directly called from the storage module once the grid-connected generation system is powered, thereby preventing a resonance from occurring once more.

Optionally, the storage module 360 may be a non-volatile ferroelectric RAM (FRAM), i.e., a random access memory, specific functions and features thereof may be referred to the conventional FRAM, which therefore need not be further described.

According to the analysis above, after the parameters of the inverters are adjusted, in a case that the valid values $U_r$ of the corrected amplitudes of the harmonics are reduced gradually and are less than $U_{rmin}$ after the preset period of time, the storage module 360 is triggered to perform a power failure protection on the corrected parameters of the grid-connected inverters. In a case that the $U_r$ is not reduced or is still greater than $U_{rmax}$ after the preset period of time, that is to say, the resonance cannot be suppressed by correcting the parameters and the resonance becomes increasingly severe. In order to protect the related devices such as an alternate current capacitor, the protection control module 370 may be directly triggered to transmit a protection signal to the inverters to control the inverters to stop operating.

In summary, in accordance with certain exemplary embodiments of the present disclosure: the current sample voltage of the preset sample point of the grid-connected generation system is monitored in a real time manner; the amplitudes of the harmonics of the current sample voltage are acquired using the preset algorithm; it is verified whether the resonance occurs in the grid-connected generation system currently based on the acquired amplitudes of e the harmonics; in a case that the resonance occurs in the grid-connected generation system, the current corrections of the parameters of the inverters in the grid-connected generation system are acquired according to a preset rule; and the parameters of the inverters are adjusted using the current corrections and a selected resonance suppressing algorithm until the resonance disappears in the grid-connected generation system. It follows that, according to the present disclosure, the resonance point of the grid-connected generation system is adjusted dynamically to suppress the resonance occurred in the grid-connected generation system, thereby providing the opportunity for establishing a reliable and stable operation of the grid-connected generation system.

Finally, it should be noted that, in the above-described embodiments, the relationship terminologies such as "first", "second" and the like are only used herein to distinguish one operation, unit or module from another, rather than to necessitate or imply that the actual relationship or order exists between the units, operations or modules. Furthermore, the terms such as "include", "comprise" or any other variants thereof are intended to be non-exclusive. Therefore, the process, method, or system including a series of elements includes not only the elements but also other elements that are not enumerated, or further includes the elements inherent for the process, method, or system. Unless expressively limited otherwise, the statement "comprising (including) one . . . " does not exclude the case that other similar elements may exist in the process, method, or system.

Various embodiments of the specification are described in a progressive way, with an emphasis placed on explaining the difference between each embodiment and the other embodiments. The same or similar parts among the embodiments can be referred to each other. For the device according to the embodiments, the corresponding descriptions are relatively simple because the device corresponds to the methods disclosed in the embodiments. The relevant portions may be referred to the description of the method parts.

The above illustration of the disclosed embodiments enables those skilled in the art to implement or practice the present disclosure. Many changes to these embodiments are apparent for those skilled in the art, and general principles defined herein can be implemented in other embodiments without departing the spirit or scope of the present disclosure. Hence, the present disclosure is not limited to the exemplary embodiments disclosed herein, but is to conform to the widest scope consistent with law and the principles and teachings disclosed herein.

The invention claimed is:

1. A method for monitoring and suppressing a resonance applied to a grid-connected generation system, wherein the method comprises:
monitoring a current sample voltage of a preset sample point of the grid-connected generation system;
acquiring amplitudes of harmonics of the current sample voltage using a preset algorithm;
verifying whether a resonance occurs in the grid-connected generation system based on the acquired amplitudes of the harmonics; and in a case that the resonance occurs in the grid-connected generation system, acquiring current corrections of parameters of inverters in the grid-connected generation system according to a preset rule, and adjusting the parameters of the inverters using the current corrections and a selected resonance suppressing algorithm until the resonance disappears in the grid-connected generation system, wherein the adjusting the parameters of the inverters using the current corrections and a preset resonance suppressing algorithm comprises:

adjusting bandwidths of the inverters using the current corrections and a preset adjustment formula, wherein the preset adjustment formula is:

$$\begin{cases} k_p = k_p + \Delta U_{out} \\ k_p < k_{p\,min} \quad k_p = k_{p\,min}, \end{cases}$$

where $K_p$ indicates a proportion control parameter, $\Delta U_{out}$ indicates the current corrections and $K_{pmin}$ indicates minimum allowable adjustment values of the bandwidths of the inverters, adjusting active damping coefficients of the inverters using a pre-stored active damping algorithm and the current corrections; and transmitting the current corrections to the inverters to control an inactive damping resistor to be connected to a respective one of the inverters.

2. The method according to claim 1, wherein the acquiring amplitudes of harmonics of the current sample voltage using a preset algorithm comprises:

calculating frequency domain values corresponding to the harmonics of the current sample voltage using an FFT algorithm formula, wherein the FFT algorithm formula is:

$$x(l) = \sum_{n=0}^{N-1} U_x(n) \times w_N^{ln}$$

$$w_N^{ln} = e^{-j2\pi n l/N}, l = 0, 1, \ldots, N-1,$$

where $U_x(n)$ indicates a discrete signal of the current sample voltage, x(l) indicates a frequency domain value corresponding to the current sample voltage after an FFT transformation is performed on the current sample voltage, N indicates the total number of sample points, $W_N^{ln}$ indicates a weight for the FFT algorithm; and calculating the amplitudes of the harmonics using the frequency domain values and a preset harmonic extracting formula, wherein the preset harmonic extracting formula is:

$$U_{amp}(k) = \sqrt{X(2k)^2 + X(2k+1)^2} \; k=0,1,\ldots,N/2-1,$$

where $U_{amp}(k)$ indicates an amplitude of the k-th harmonic, X(2k) indicates a value of a real part of the frequency domain value corresponding to a k-th harmonic, X(2k+1) indicates a value of an imaginary part of the frequency domain value corresponding to the k-th harmonic.

3. The method according to claim 2, wherein the verifying whether a resonance occurs in the grid-connected generation system based on the acquired amplitudes of the harmonics comprises:

calculating valid values of the amplitudes of the harmonics within a preset resonance frequency band using the amplitudes of the harmonics and a preset valid value calculation formula, wherein the preset valid value calculation formula is:

$$U_r = \frac{1}{N_1} \sqrt{\sum_{k=M_1}^{M_2} U_{amp}(k)^2},$$

where $U_r$ indicates the valid values of the amplitudes of the harmonics within the preset resonance frequency band [$f_{min}$, $f_{max}$], $N_1$ indicates the total number of resonances occurred within the preset resonance frequency band, $M_1$ indicates the number of resonances corresponding to a minimum allowable resonance frequency $f_{min}$, $M_2$ indicates the number of resonances corresponding to a maximum allowable resonance frequency $f_{max}$, and $U_{amp}(k)$ indicates the amplitude of the k-th harmonic; and verifying whether the valid values of the amplitudes of the harmonics are not less than a preset harmonic threshold, wherein it is determined that the resonance occurs in the grid-connected generation system in a case that the valid values of the amplitudes of the harmonics are not less than the preset harmonic threshold.

4. The method according to claim 3, wherein the acquiring current corrections of parameters of inverters in the grid-connected generation system according to a preset rule comprises:

calculating differences between the valid values of the amplitudes of the harmonics and the preset harmonic threshold to obtain input errors;

adjusting the input errors in proportion or proportion-integral to obtain current output controls; and clipping amplitudes of the current output controls to obtain the current corrections of the parameters of the inverters in the grid-connected generation system.

5. The method according to claim 1, wherein after the adjusting the parameters of the inverters using the current corrections and a preset resonance suppressing algorithm, the method further comprises:

controlling the inverters of the grid-connected generation system to stop operating in a case that the resonance does not disappear in the grid-connected generation system after a preset period of time.

6. The method according to claim 1, wherein in a case that the resonance disappears in the grid-connected generation system, the method further comprises:

performing a power failure protection on the adjusted parameters of the inverters.

7. A device for monitoring and suppressing a resonance applied to a grid-connection generation system, wherein the device comprises:

a sample conditioning circuit connected to a preset sample point of the grid-connected generation system and configured to monitor a current sample voltage of the preset sample point;

a controller connected to the sample conditioning circuit and configured to acquire amplitudes of harmonics of the current sample voltage using a preset algorithm, verify whether a resonance occurs in the grid-connected generation system based on the acquired amplitudes of the harmonics, and acquire current corrections of parameters of inverters in the grid-connected generation system according to a preset rule in a case that the resonance occurs in the grid-connected generation system;

a communication bus connected to the controller and the inverters in the grid-connected generation system and configured to transmit the current corrections acquired by the controller to the inverters respectively; and an adjusting module connected to the controller and the inverters and configured to adjust the parameters of the inverters using the current corrections and a preset resonance suppressing algorithm until the resonance disappears in the grid-connected generation system, wherein the adjusting module comprises a first adjusting unit configured to adjust bandwidths of the inverters using the current corrections and a preset adjustment formula, wherein the preset adjustment formula is:

$$\begin{cases} k_p = k_p + \Delta U_{out} \\ k_p < k_{p\,min} \quad k_p = k_{p\,min}, \end{cases}$$

where $K_p$ indicates a proportion control parameter, $\Delta U_{out}$ indicates the current corrections and $K_{pmin}$ indicates minimum allowable adjustment values of the bandwidths of the inverters;

a second adjusting unit configured to adjust active damping coefficients of the inverters using a preset active damping algorithm and the current corrections; and a third adjusting unit configured to transmit respectively the current corrections to the inverters to control an inactive damping resistor to be connected to a respective one of the inverters.

8. The device according to claim 7, wherein the controller comprises:

a frequency domain calculation module configured to calculate frequency domain values corresponding to the current sample voltage using an FFT algorithm formula, wherein the FFT algorithm formula is:

$$x(l) = \sum_{n=0}^{N-1} U_x(n) \times w_N^{ln}$$

$$w_N^{ln} = e^{-j2\pi nl/N}, l = 0, 1, \ldots, N-1,$$

where $U_x(n)$ indicates a discrete signal of the current sample voltage, $x(l)$ indicates a frequency domain value corresponding to the current sample voltage after an FFT transformation is performed on the current sample voltage, N indicates the total number of sample points, and $W_N^{ln}$ indicates a weight for the FFT algorithm;

an amplitude calculation module configured to calculate the amplitudes of the harmonics using the frequency domain values and a preset harmonic extracting formula, wherein the preset harmonic extracting formula is:

$$U_{amp}(k) = \sqrt{X(2k)^2 + X(2k+1)^2} \quad k=0,1,\ldots,N/2-1,$$

where $U_{amp}(k)$ indicates an amplitude of the k-th harmonic, $X(2k)$ indicates a value of a real part of the frequency domain value corresponding to a k-th harmonic, $X(2k+1)$ indicates a value of an imaginary part of the frequency domain value corresponding to the k-th harmonic;

a valid value calculation module configured to calculate valid values of the amplitudes of the harmonics within a preset resonance frequency band using the amplitudes of the harmonics and a preset valid value calculation formula, wherein the preset valid value calculation formula is:

$$U_r = \frac{1}{N_1} \sqrt{\sum_{k=M_1}^{M_2} U_{amp}(k)^2},$$

where $U_r$ indicates the valid values of the amplitudes of the harmonics within the preset resonance frequency band $[f_{min}, f_{max}]$, $N_1$ indicates the total number of resonances occurred within the preset resonance frequency band, $M_1$ indicates the number of resonances corresponding to a minimum allowable resonance frequency $f_{min}$, $M_2$ indicates the number of resonances corresponding to a maximum allowable resonance frequency $f_{max}$, and $U_{amp}(k)$ indicates the amplitude of the k-th harmonic;

a verifying module configured to verify whether the valid values of the amplitudes of the harmonics are not less than a preset harmonic threshold;

an error calculation module configured to calculate differences between the valid values of the amplitude of the harmonics and the preset harmonic threshold to obtain input errors;

a control acquiring module configured to adjust the input errors in proportion or proportion-integral to obtain current output controls; and an amplitude clipping module configured to clip amplitudes of the current output controls to obtain the current corrections of the parameters of the inverters in the grid-connected generation system.

* * * * *